(12) United States Patent
Suehiro et al.

(10) Patent No.: US 6,900,587 B2
(45) Date of Patent: May 31, 2005

(54) LIGHT-EMITTING DIODE

(75) Inventors: Yoshinobu Suehiro, Nishikasugai-gun (JP); Hideyuki Nakano, Nishikasugai-gun (JP)

(73) Assignee: Toyoda Gosei Co., Ltd., Nishikasugai-gun (JP)

( * ) Notice: Subject to any disclaimer, the term of this patent is extended or adjusted under 35 U.S.C. 154(b) by 0 days.

(21) Appl. No.: 10/179,372

(22) Filed: Jun. 26, 2002

(65) Prior Publication Data

US 2003/0002272 A1 Jan. 2, 2003

(30) Foreign Application Priority Data

Jun. 28, 2001 (JP) ..................... P2001-195961

(51) Int. Cl.[7] .............................. H01J 1/62; H01J 63/04
(52) U.S. Cl. .................. 313/503; 313/498; 313/504
(58) Field of Search ................. 313/498, 499, 313/501, 503, 504; 257/98–100

(56) References Cited

U.S. PATENT DOCUMENTS 5,959,316 A * 9/1999 Lowery ..................... 257/98
6,340,824 B1 * 1/2002 Komoto et al. ............. 257/99
6,417,019 B1 * 7/2002 Mueller et al. ............. 438/29
6,521,915 B2 * 2/2003 Odaki et al. ................ 257/98

FOREIGN PATENT DOCUMENTS

| JP | 11-068166 | 3/1999 |
| JP | 11-274572 | 10/1999 |

* cited by examiner

Primary Examiner—Joseph Williams
Assistant Examiner—Kevin Quarterman
(74) Attorney, Agent, or Firm—McGinn & Gibb, PLLC

(57) ABSTRACT

In an LED, when electric power is supplied to a blue light-emitting element through a pair of leads, light is emitted upward from an upper surface of the blue light-emitting element and, at the same time, light is radiated from side and lower surfaces of the blue light-emitting element so that a fluorescent substance is irradiated with the light. The latter light is reflected by a front surface of the fluorescent substance or by a concave reflecting mirror serving as a highly reflective material, so that the reflected light is radiated upward as excitation light (fluorescence) or as irradiation light. Because a radiating surface of a convex lens is formed above the concave reflecting mirror, the excitation light and irradiation light emitted thus are condensed by the convex lens and radiated externally with high external radiation efficiency.

6 Claims, 5 Drawing Sheets

LIGHT-EMITTING DIODE

The present application is based on Japanese Patent Application No. 2001-195961, which is incorporated herein by reference.

BACKGROUND OF THE INVENTION

The present invention relates to a light-emitting diode (hereinafter abbreviated to "LED") in which a fluorescent material generates fluorescence when excited by light emitted from a light-emitting element. In this specification, an LED chip itself is called a "light-emitting element" and a light-emitting device including the LED chip mounted thereon, and an optical device such as a package resin or a lens system is called a "light-emitting diode" or an "LED" as a whole.

In the related art, there is known a light-emitting diode in which a light-emitting element emitting blue light is covered with a fluorescent substance or a fluorescent substance-containing resin which generates yellow light when excited by the blue light emitted from the light-emitting element. In this light-emitting diode, the blue light emitted from the light-emitting element and the yellow light generated from the fluorescent substance excited by the blue light are mixed with each other, so that the mixed light viewed as white light can be radiated to the outside. FIG. 9 shows such a specific example of the light-emitting diode. That is, FIG. 9 is a longitudinal sectional view showing the overall configuration of the related-art light-emitting diode.

The light-emitting diode 81 has a blue light-emitting element 82, a pair of silver-plated leads 83a and 83b for supplying electric power to the blue light-emitting element 82, and a cup 83c provided in an upper end portion of one 83a of the leads. The blue light-emitting element 82 is mounted on a bottom surface of the cup 83c. Two electrodes on a surface of the blue light-emitting element 82 are bonded and electrically connected to the pair of leads 83a and 83b by two wires 84a and 84b respectively. The cup 83c is filled with a fluorescent substance 85 so that the blue light-emitting element 82 is covered with the fluorescent substance 85. The fluorescent substance 85 generates yellow light when excited by blue light. The blue light-emitting element 82, the fluorescent substance 85, and so on, are sealed with a transparent epoxy resin 86. At the same time, a radiating surface of a convex lens 87 is molded of the transparent epoxy resin 86. In this configuration, when blue light is radiated from the blue light-emitting element 82, a part of the blue light directly passing through the fluorescent substance 85, and yellow light generated from the fluorescent substance 85 excited by the remaining blue light are mixed with each other in the transparent epoxy resin 86. The mixed light is radiated externally so as to be viewed as white light.

The configuration is, however, inferior in the efficiency of externally radiating the blue light emitted from the blue light-emitting element 82, and the yellow light generated when the fluorescent substance 85 is excited. That is, only a part of blue light transmitted through the layer of the fluorescent substance 85 is radiated to the outside. Because scattering of light occurs in the fluorescent substance layer 85, the average optical path to the outside is so long that absorption loss in the fluorescent substance layer 85 becomes large. Although a part of the scattered light in the fluorescent substance 85 enters the blue light-emitting element 82 again, absorption loss in the blue light-emitting element 82 is, however, large because the refractive index of the material constituting the light-emitting element is so high that the light is hardly radiated externally and easily absorbed to the material of the light-emitting element. On the other hand, yellow excitation light is generated in the whole of the fluorescent substance 85 when the blue light passes through the fluorescent substance 85. The quantity of the generated yellow excitation light is, however, large in the proximity of the blue light-emitting element 82 which is high in density of blue light. For this reason, absorption loss of the yellow light is large in the fluorescent substance 85 and in the blue light-emitting element 82 like absorption loss of the blue light. As described above, in a structure in which light emitted from the light-emitting element and transmitted through the fluorescent substance layer, and light generated by excitation of the fluorescent substance layer are radiated externally, there is a problem that absorption loss is large.

SUMMARY OF THE INVENTION

An object of the invention is to provide a light-emitting diode in which the efficiency of externally radiating both light emitted from a light-emitting element and light generated by excitation (fluorescence) can be enhanced.

(1) According to the invention, there is provided a light-emitting diode including: a light-emitting element; and a fluorescent face made of a fluorescent substance containing at least one of inorganic or organic fluorescent materials, the fluorescent substance being formed by application on a highly reflective material; wherein light is extracted externally from a side of the fluorescent face irradiated with light emitted from the light-emitting element.

In the LED configured as described above, light emitted from the light-emitting element is radiated externally after the light is reflected by a front or rear surface of the fluorescent face. Generally, both reflection of the light emitted from the light-emitting element for performing irradiation (hereinafter referred to as "irradiation light"), and generation of fluorescence caused by excitation of the fluorescent material (hereinafter referred to as "excitation light") occur most frequently in the front surface of the fluorescent face and its vicinity, the excitation of the fluorescent material being carried out when the light emitted from the light-emitting element is absorbed to the fluorescent material. Therefore, the irradiation light reflected by the front surface of the fluorescent face and the excitation light can be radiated to the outside efficiently without being absorbed to the fluorescent substance. On the other hand, a part of light reflected by the highly reflective material after the light hits the rear surface of the fluorescent face passes through the fluorescent material while the light makes a reciprocating motion in the fluorescent material. Therefore, a large part of the excitation light is mixed with the part of the irradiation light, so that the mixed light is radiated externally. In this manner, the light reflected by the front surface of the fluorescent face and the light reflected by the rear surface of the fluorescent face are combined with each other. Hence, the external radiation efficiency is improved greatly compared with the related art.

In such a manner, light emitted from the light-emitting element is radiated externally after the light is reflected by the front or rear surface of the fluorescent face. As a result, there can be provided a light-emitting diode enhanced in the efficiency in externally radiating both light emitted from the light-emitting element and excitation light (fluorescence).

(2) According to the invention, there is provided a light-emitting diode having the configuration defined in (1), wherein the fluorescent face formed on the highly reflective material is disposed to surround side surfaces of the light-emitting element.

When the fluorescent face formed on the highly reflective material is provided to surround the side surfaces of the light-emitting element as described above, light emitted from the side surfaces of the light-emitting element can be also reflected by the fluorescent face so as to be radiated externally as excitation light and irradiation light. Hence, the external radiation efficiency can be improved more greatly.

(3) According to the invention, there is provided a light-emitting diode having the configuration defined in (1) or (2), wherein the fluorescent face is provided opposite to the light-emitting element.

In the LED configured as described above, a large part of light emitted from a light-emitting surface of the light-emitting element is reflected by the fluorescent face. Hence, the quantity of light reflected by the front and rear surfaces of the fluorescent face is increased remarkably. The light is radiated externally as excitation light and irradiation light. Hence, the external radiation efficiency can be improved greatly.

When the fluorescent face formed on the highly reflective material is provided opposite to the light-emitting element as described above, there can be provided a light-emitting diode greatly improved in the efficiency of externally radiating the excitation light and the irradiation light.

(4) According to the invention, there is provided a light-emitting diode having the configuration defined in any of (1) through (3), wherein the fluorescent face is formed in a paraboloid of revolution.

(5) According to the invention, there is provided a light-emitting diode having the configuration defined in any one of (1) to (3), wherein the light-emitting element emits ultraviolet light for performing irradiation; and the fluorescent substance is made of at least one of inorganic and organic fluorescent materials and formed by applying the at least one fluorescent material on the highly reflective material so that the fluorescent material emits light when irradiated with the ultraviolet light.

Fluorescent materials emitting light when irradiated with ultraviolet light may generate fluorescence in various colors. Hence, light in any color selected from various colors can be radiated externally from the fluorescent face. Moreover, there is no fear that the problem in color separation between irradiation light and excitation light occurs because irradiation with ultraviolet light invisible to human eyes is used for generating fluorescence. Further, among fluorescent materials which emit light when irradiated with ultraviolet light, some fluorescent materials emit light intensively in the three primary colors, that is, red, green and blue. Hence, when these fluorescent materials are mixed in optimal mixture proportions to form a fluorescent substance, an LED emitting bright white light can be fabricated.

In this manner, when a light-emitting element emitting ultraviolet light is combined with fluorescent materials emitting light when irradiated with such ultraviolet light, a light-emitting diode emitting light in a color selected from various colors can be fabricated without causing any problem in color separation and, further, a light-emitting diode emitting bright white light can be fabricated.

DETAILED DESCRIPTION OF THE PREFERRED EMBODIMENTS

Embodiments of the invention will be described below with reference to the drawings.

Embodiment 1

Figure 1:
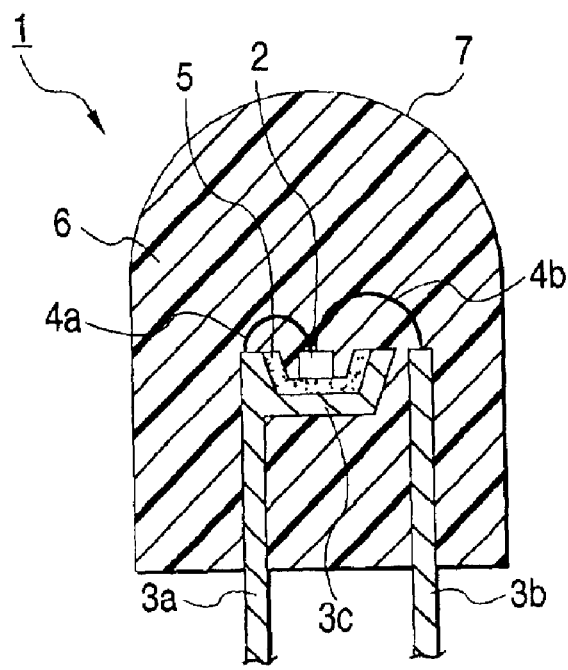
FIG. 1 is a longitudinal sectional view showing the overall configuration of a light-emitting diode according to Embodiment 1 of the invention.
Figure 2:
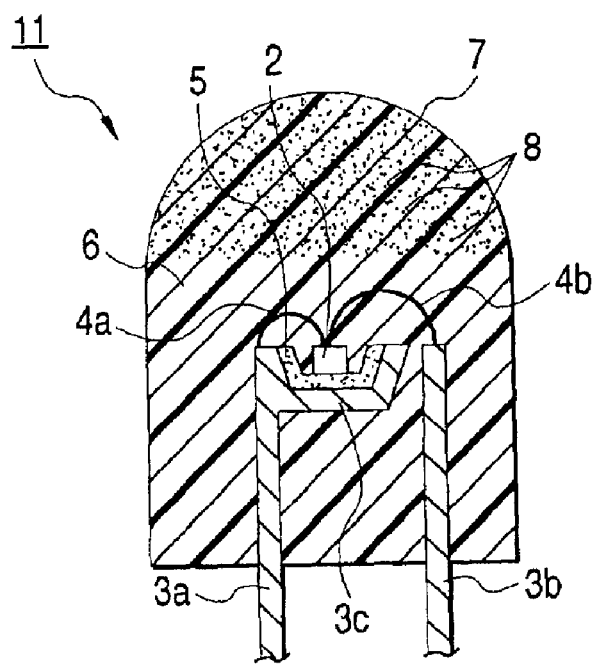
FIG. 2 is a longitudinal sectional view showing the overall configuration of a modified example of the light-emitting diode according to Embodiment 1 of the invention.

First, referring to FIGS. 1 and 2, Embodiment 1 of the invention will be described. FIG. 1 is a longitudinal sectional view showing the overall configuration of a light-emitting diode according to Embodiment 1 of the invention. FIG. 2 is a longitudinal sectional view showing the overall configuration of a modified example of the light-emitting diode according to Embodiment 1 of the invention.

As shown in FIG. 1, an LED 1 according to Embodiment 1 has a blue light-emitting element 2, a pair of silver-plated leads 3a and 3b for supplying electric power to the blue light-emitting element 2, a concave reflecting mirror 3c provided in an upper end portion of one 3a of the leads, and a fluorescent substance 5 containing a fluorescent material and applied on a concave surface of the concave reflecting mirror 3c to have a uniform thickness. The blue light-emitting element 2 is mounted on a bottom portion of the concave surface of the concave reflecting mirror 3c through transparent paste. The blue light-emitting element 2 is bonded and electrically connected to the pair of leads 3a and 3b by wires 4a and 4b respectively. The blue light-emitting element 2, forward end portions of the pair of leads 3a and 3b, the concave reflecting mirror 3c, the wires 4a and 4b and the fluorescent substance 5 are sealed with a transparent epoxy resin 6. At the same time, a radiating surface of a convex lens 7 is molded of the transparent epoxy resin 6.

In the LED 1 configured as described above, when electric power is supplied to the blue light-emitting element 2 through the pair of leads 3a and 3b, light is emitted upward from an upper surface of the blue light-emitting element 2, and at the same time, light is radiated also from side and lower surfaces of the blue light-emitting element 2 so that the fluorescent substance 5 is irradiated with the light radiated from the side and lower surfaces. Both reflection of light emitted from the blue light-emitting element 2 for performing irradiation, and generation of fluorescence caused by excitation of the fluorescent material occur most frequently in surfaces of the fluorescent substance 5 and their vicinity, the excitation of the fluorescent material being carried out when the light emitted from the light-emitting element 2 is absorbed into the fluorescent material. Accordingly, blue light and yellow light reflected by these surfaces are radiated upward without being absorbed to the fluorescent substance 5. Because the radiating surface of the convex lens 7 is formed above the concave reflecting mirror 3c, the blue light and yellow light emitted thus are mixed with each other in the transparent epoxy resin 6 so as to be condensed as white light and radiated externally.

On the other hand, yellow excitation light is generated over the whole optical path of the blue light, until the blue light returns to the surfaces of the fluorescent substance 5 after the blue light passes through the fluorescent substance 5 and is reflected by the concave reflecting mirror 3c serving as a highly reflective material. Absorption loss in the fluorescent substance 5 is, however, reduced because of the presence of the concave reflecting mirror 3c as a highly reflective material. The blue light and a considerable part of yellow light can be radiated upward from the inside of the fluorescent substance 5. On this occasion, light reflected by the concave reflecting mirror 3c serving as a highly reflective material passes through the fluorescent substance 5 while the light makes a reciprocating motion in the fluorescent substance 5. Accordingly, the thickness of the fluorescent substance can be reduced to a half of the thickness required in a related-art transmission type LED. Hence, a large part of excitation light and a part of irradiation light are mixed with each other, so that the mixed light is radiated externally. In addition, because the light passes through the fluorescent material while the light makes a reciprocating motion in the fluorescent material, the coating thickness of the fluorescent substance 5 at the time of the formation of the fluorescent face can be reduced to thereby attain reduction in cost.

Figure 9:
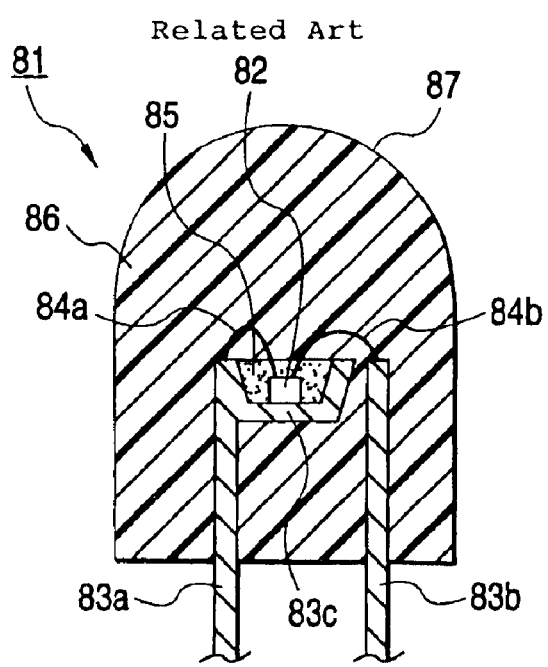
FIG. 9 is a longitudinal sectional view showing the overall configuration of a light-emitting diode according to the related art.

In such a manner, this embodiment is different from the related-art example shown in FIG. 9 in that a large part of blue light emitted from the upper surface of the blue light-emitting element 2 is condensed directly by the convex lens 7 and then radiated externally without being transmitted through the fluorescent substance 5. In addition, as for the blue light emitted from the side and lower surfaces of the blue light-emitting element 2 and hitting the fluorescent substance 5, both reflection of the blue light and generation of yellow light by excitation of the fluorescent substance 5 absorbing the blue light occur most frequently in surfaces of the fluorescent substance 5 and their vicinity. The blue light and the yellow light reflected by the surfaces of the fluorescent substance are radiated upward without being absorbed to the fluorescent substance 5 so as to be condensed by the convex lens 7 and then radiated externally. In addition, the fluorescent substance 5 generates yellow light when excited by the blue light entering the fluorescent substance 5. Some part of the yellow light is scattered so as to go out of the surfaces of the fluorescent substance 5. That is, a part of the yellow light reaches the concave reflecting mirror 3c serving as a highly reflective material and is then absorbed to the fluorescent substance 5 while the light is reflected by the concave reflecting mirror 3c and passes through the fluorescent substance 5, and the other part of the yellow light reaches the surfaces of the fluorescent substance 5 and is radiated externally.

As described above, in the LED 1 according to Embodiment 1, light emitted from the blue light-emitting element 2 is reflected by the front surface or the rear surface (concave reflecting mirror 3c) of the fluorescent substance 5. When the reflected light to be radiated externally is combined, the efficiency of externally radiating both the blue light emitted from the light-emitting element and the excitation light (yellow light) can be enhanced.

Referring to FIG. 2, a modified example of Embodiment 1 will be described below. Incidentally, parts the same as those in FIG. 1 are referenced correspondingly and the description of these parts will be omitted. As shown in FIG. 2, an LED 11 as a modified example of Embodiment 1 is different from the LED 1 in that a diffusing agent 8 mixed with the transparent epoxy resin 6 is disposed above the concave reflecting mirror 3c. As a result, irradiation light emitted from the blue light-emitting element 2 and yellow light generated from the fluorescent substance 5 excited by the irradiation light are diffused by the diffusing agent 8 so as to be mixed with each other well. Hence, it is possible to greatly reduce the phenomenon of color separation in which blue light and yellow light are not mixed with each other as white light but separated from each other individually as they are.

In such a manner, in the LED 11 in a modified example of Embodiment 1, when the diffusing agent 8 is mixed in the transparent epoxy resin 6, the radiation light and the excitation light are mixed with each other well so that the phenomenon of color separation is reduced greatly with the result that light in a desired color can be radiated externally.

Embodiment 2

Figure 3:
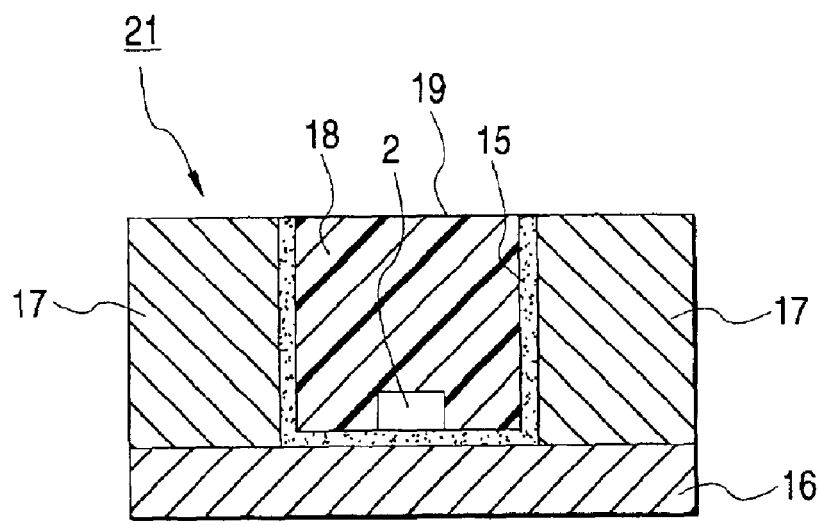
FIG. 3 is a longitudinal sectional view showing the overall configuration of a light-emitting diode according to Embodiment 2 of the invention.
Figure 4:
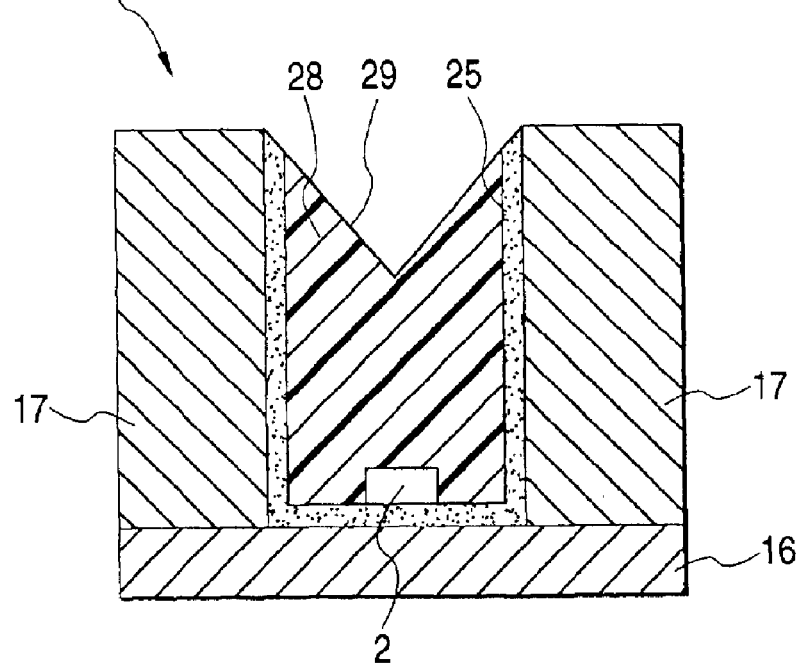
FIG. 4 is a longitudinal sectional view showing the overall configuration of a modified example of the light-emitting diode according to Embodiment 2 of the invention.

Referring to FIGS. 3 and 4, Embodiment 2 of the invention will be described below. FIG. 3 is a longitudinal sectional view showing the overall configuration of a light-emitting diode according to Embodiment 2 of the invention. FIG. 4 is a longitudinal sectional view showing the overall configuration of a modified example of the light-emitting diode according to Embodiment 2 of the invention.

As shown in FIG. 3, in an LED 21 according to Embodiment 2, a light-emitting element 2 is mounted on a disk-like white substrate 16 (corresponding to reflecting substrate) provided with a circuit pattern formed thereon. A donut-like white reflecting frame 17 disposed to surround the light-emitting element 2 is fixed on the white substrate 16. A fluorescent substance 15 containing a fluorescent material is applied on the whole surfaces of the white substrate 16 and the white reflecting frame 17 which surround the light-emitting element 2. Thus, a fluorescent face having a uniform thickness is formed. A hollow portion provided in the inside of the fluorescent face is filled with a transparent epoxy resin 18. At the same time, a radiating surface 19 is formed as an upper surface of the resin 18.

Of light emitted from the upper surface of the light-emitting element 2, some part passes through the transparent epoxy resin 18 and then radiated directly to the outside from the radiating surface 19, while the other part hits the fluorescent substance 15 in a side surface portion of the fluorescent face and is reflected by the front surface of the fluorescent substance 15 or reflected by the white reflecting frame 17 disposed as a highly reflective material on the rear surface of the fluorescent substance 15. The other part reflected thus excites the fluorescent material to be converted into excitation light and radiated from the radiating surface 19. In this LED 21, light is converted into excitation light at a high rate because the fluorescent face makes a large solid angle with respect to the light-emitting element 2. Further, light reflected by an interface 19 between the epoxy resin 18 having a refractive index n=1.5 and air having a refractive index n=1.0 reaches the fluorescent face again, so that the light is converted into excitation light and then radiated. On the other hand, light emitted from the side surface of the light-emitting element 2 hits the fluorescent substance 15 in the side or bottom surface of the fluorescent face. The light excites the fluorescent material to generate light as excitation light. The excitation light is moved upward while reflected between portions of the fluorescent face. Finally, the light is radiated externally from the radiating surface 19.

As described above, in the LED 21 according to Embodiment 2, the fluorescent substance 15 is applied on both the white substrate 16 and the white reflecting frame 17 which serve as highly reflective materials to thereby form a fluorescent face. Irradiation light emitted from the light-emitting element 2, and excitation light generated from the fluorescent material excited by a part of the irradiation light reflected by the front and rear surfaces of the fluorescent face are mixed with each other, so that the mixed light is radiated externally from the radiating surface 19 provided as an upper surface.

Referring to FIG. 4, a modified example of Embodiment 2 will be described below. Incidentally, parts the same as those in FIG. 3 are referenced correspondingly and the description of these parts will be omitted. As shown in FIG. 4, an LED 31 as a modified example of Embodiment 2 is different from the LED 21 in that the cylindrical filler portion made of the transparent epoxy resin 18 is cut into a conical shape on the radiating surface side. As a result, the radiating surface 29 is shaped like a convex cone. Hence, all light directly radiated from the light-emitting element 2 to the radiating surface 29 is reflected by the radiating surface 29 so that the fluorescent face around the transparent epoxy resin 28 is irradiated with the reflected light. Hence, all light emitted from the light-emitting element 2 irradiates the fluorescent substance 25 only once. As a result, all light radiated externally from the radiating surface 29 is a uniform mixture of irradiation light and excitation light. The LED can be produced as an LED free from color separation.

Embodiment 3

Figure 5A:
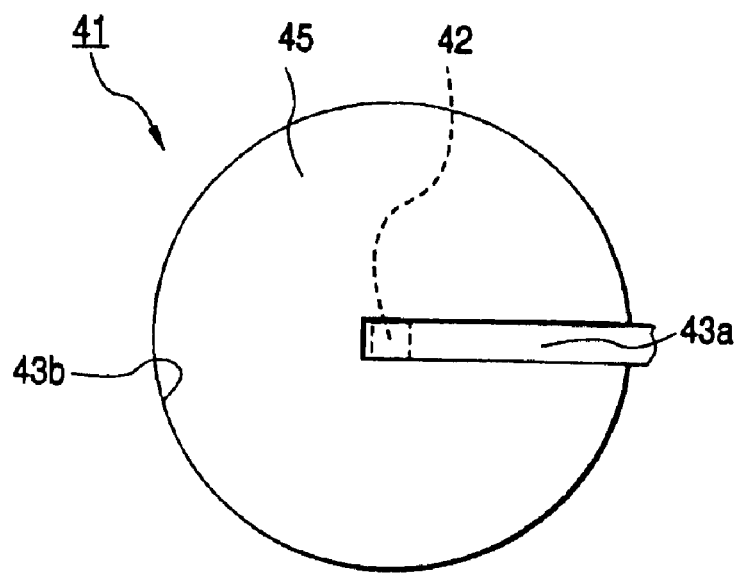
FIG. 5A is a plan view of a light-emitting diode according to Embodiment 3 of the invention.
Figure 5B:
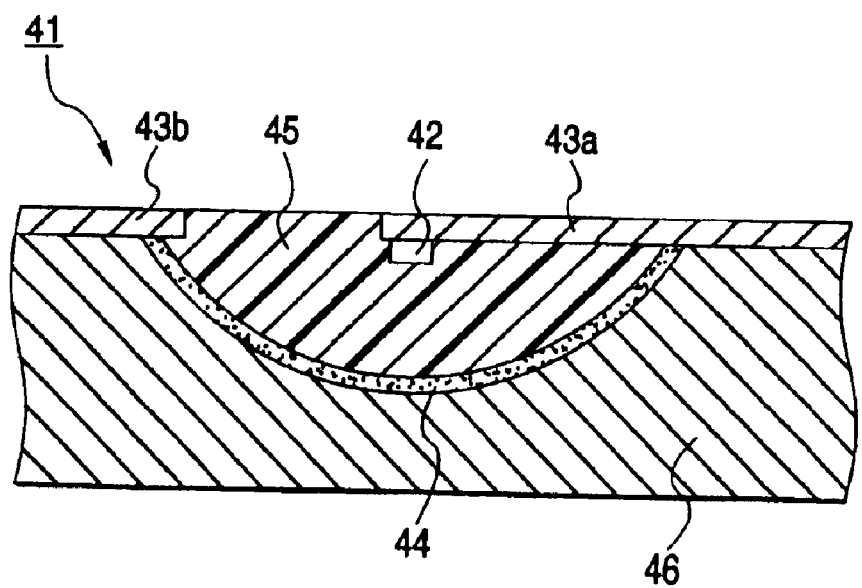
FIG. 5B is a longitudinal sectional view showing the overall configuration of the light-emitting diode.

Referring to FIGS. 5A and 5B, Embodiment 3 of the invention will be described below. FIG. 5A is a plan view of a light-emitting diode according to Embodiment 3 of the invention. FIG. 5B is a longitudinal sectional view showing the overall configuration of the light-emitting diode.

As shown in FIGS. 5A and 5B, in the LED 41 according to Embodiment 3, a light-emitting element 42 is mounted on a lower surface of a white substrate 43a protruded into a circular radiating surface. An upper surface of a white reflecting substrate 46 is shaped like a paraboloid of revolution with the light-emitting element 42 as its focal point so that the upper surface of the white reflecting substrate 46 is disposed opposite to the light-emitting element 42. A fluorescent substance 44 is applied on the paraboloid of revolution to thereby form a fluorescent face having a uniform thickness. A hollow portion between the light-emitting element 42 and the fluorescent substance 44 is filled with a transparent epoxy resin 45. With this configuration, in the LED 41, almost all light emitted from the light-emitting element 42 is radiated onto the fluorescent face. On this occasion, light emitted from the light-emitting element 42 is not radiated to the outside directly but is always radiated to the outside after the light hits the fluorescent substance 44 once. In addition, because the fluorescent substance 44 is formed on the white reflecting substrate 46 which is a highly reflective material, the thickness of the fluorescent substance 44 can be reduced to a half of the thickness required in the related-art transmission type LED.

In such a manner, in the LED 41 according to Embodiment 3, all reflected light is radiated in one direction (upward direction in FIG. 5B) in a state in which irradiation light and excitation light are mixed with each other. Hence, there is no fear of occurrence of the problem in color separation. Moreover, external radiation efficiency is enhanced so that the quantity of light can be increased. The LED 41 can be provided as a bright light-emitting diode.

Embodiment 4

Figure 6:
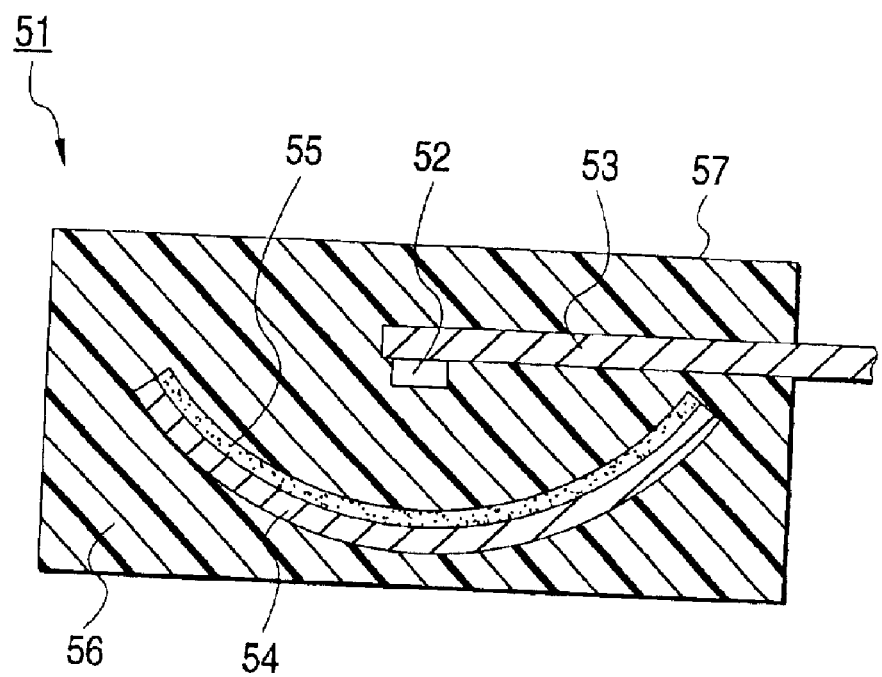
FIG. 6 is a longitudinal sectional view showing the overall configuration of a light-emitting diode according to Embodiment 4 of the invention.
Figure 7:
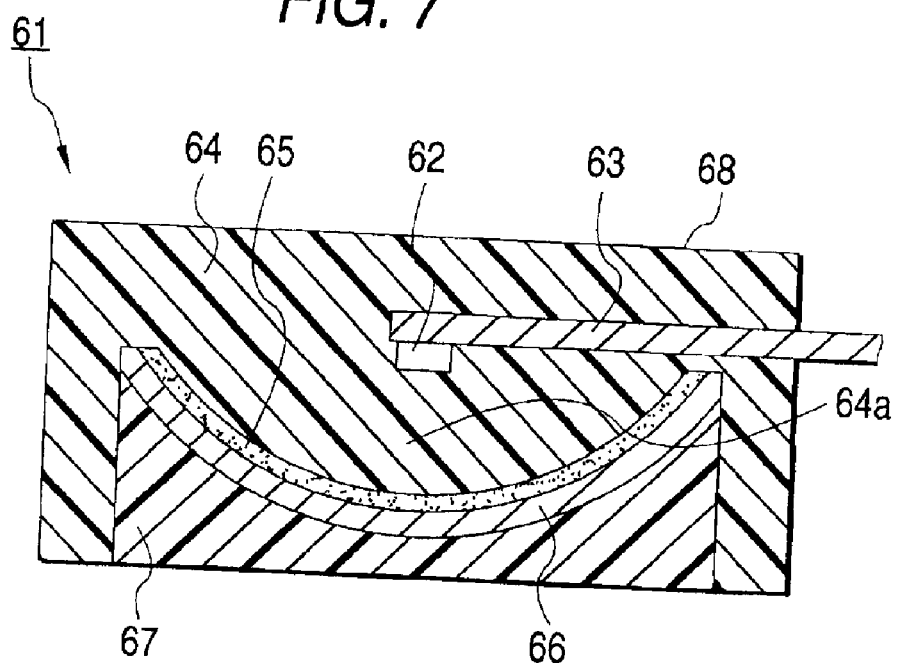
FIG. 7 is a longitudinal sectional view showing the overall configuration of a modified example of the light-emitting diode according to Embodiment 4 of the invention.

Referring to FIGS. 6 and 7, Embodiment 4 of the invention will be described below. FIG. 6 is a longitudinal sectional view showing the overall configuration of a light-emitting diode according to Embodiment 4 of the invention. FIG. 7 is a longitudinal sectional view showing the overall configuration of a modified example of the light-emitting diode according to Embodiment 4 of the invention.

As shown in FIG. 6, in the LED 51 according to Embodiment 4, a metal plate 54 of aluminum is disposed as a highly reflective material opposite to a light-emitting element 52 mounted on a lower surface of a white substrate 53. The metal plate 54 of aluminum is shaped like a paraboloid of revolution with the light-emitting element 52 as its focal point in the same manner as in Embodiment 3. A fluorescent substance 55 containing a fluorescent material is applied on an upper surface of the metal plate 54 to thereby form a fluorescent face having a uniform thickness. The metal plate 54, the fluorescent substance 55, the light-emitting element 52 and a forward end of the white substrate 53 are sealed with a transparent epoxy resin 56. At the same time, a radiating surface 57 is formed on the rear side of the light-emitting element 52.

In the LED 51 configured as described above, almost all light emitted from the light-emitting element 52 is radiated onto the fluorescent face. On this occasion, light emitted from the light-emitting element 52 is not radiated to the outside directly but is always radiated to the outside after the light hits the fluorescent substance 55 once. In addition, because the fluorescent substance 55 is formed on the metal plate 54 which is a highly reflective material, the thickness of the fluorescent substance 55 can be reduced to a half of the thickness required in the related-art transmission type LED. That is, the light is radiated upward to the outside in a direction substantially perpendicular to the radiating surface 57. Hence, in the LED 51 according to Embodiment 4, all reflected light is radiated in one direction (upward direction in FIG. 6) in a state in which irradiation light and excitation light are mixed with each other. Hence, there is no fear of occurrence of the problem in color separation. Moreover, external radiation efficiency is enhanced so that the quantity of light can be increased. As a result, the LED 51 can be provided as a bright LED.

Referring to FIG. 7, a modified example of Embodiment 4 will be described below. As shown in FIG. 7, in the LED 61 according to a modified example of Embodiment 4, the light-emitting element 62 mounted on a lower surface of a white substrate 63 is sealed with a transparent epoxy resin 64. At the same time, a bottom surface 64a opposite to the light-emitting element 62 is shaped like a paraboloid of revolution. A fluorescent substance 65 containing a fluorescent material is applied on a lower side of the bottom surface 64a so that the fluorescent substance 65 has a uniform thickness. A silver thin film 66 is further formed as a highly reflective material on a lower side of the fluorescent substance 65 by vapor deposition. A space following the silver thin film 66 is filled with a transparent epoxy resin 67.

In the LED 61 fabricated thus, the silver thin film 66 disposed as a highly reflective material opposite to the light-emitting element 62 is shaped like a paraboloid of revolution. A fluorescent face made of the fluorescent substance 65 is formed on the silver thin film 66. The fluorescent face is wholly sealed with the transparent epoxy resins 64 and 67. At the same time, a radiating surface 68 is formed as an upper surface. As a result, the LED 61 has a similar configuration to the LED 51 according to Embodiment 4. Hence, almost the whole part of light emitted from the light-emitting element 62 is radiated onto the fluorescent face. On this occasion, light emitted from the light-emitting element 62 is not radiated to the outside directly but is always radiated to the outside after the light hits the fluorescent substance 65 once. In addition, because the fluorescent substance 65 is formed on the silver thin film 66 which is a highly reflective material, the thickness of the fluorescent substance 65 can be reduced to a half of the thickness required in the related-art transmission type LED. That is, light is radiated upward to the outside in a direction substantially perpendicular to the radiating surface 68. Hence, in the LED 61, all reflected light is radiated in one direction in a state in which irradiation light and excitation light are mixed with each other. Hence, there is no fear of occurrence of the problem in color separation. Moreover, external radiation efficiency is enhanced so that the quantity of light can be increased. As a result, the LED 61 can be provided as a bright LED.

In such a manner, the LED 61 according to the modified example of Embodiment 4 can be formed to have a similar configuration to that of the LED 51 but by a method totally different from the method used for forming the LED 51.

Similar advantage and effect to those in the LED 51 can be obtained by the LED 61.

Embodiment 5

Figure 8:
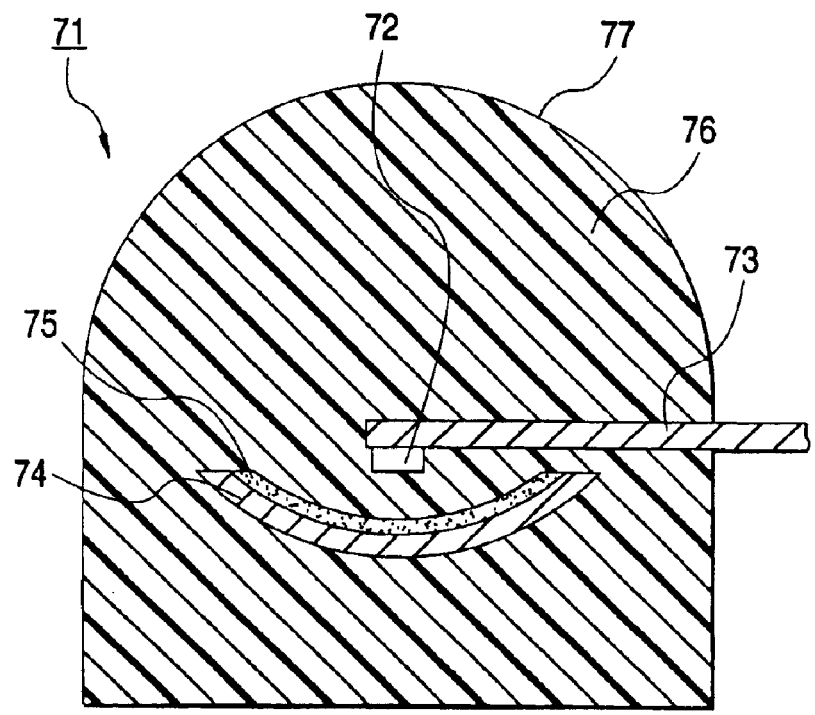
FIG. 8 is a longitudinal sectional view showing the overall configuration of a light-emitting diode according to Embodiment 5 of the invention.

Referring to FIG. 8, Embodiment 5 of the invention will be described below. FIG. 8 is a longitudinal sectional view showing the overall configuration of a light-emitting diode according to Embodiment 5 of the invention.

As shown in FIG. 8, in an LED 71 according to Embodiment 5, a metal plate 74 is disposed as a highly reflective material opposite to the light-emitting element 72 mounted on a lower surface of a white substrate 73. The metal plate 74 is shaped like a paraboloid of revolution with the light-emitting element 72 as its focal point. A fluorescent substance 75 containing a fluorescent material is applied on an upper surface of the metal plate 74 to thereby form a fluorescent face having a uniform thickness. The light-emitting element 72, a forward end portion of the white substrate 73, the metal plate 74 and the fluorescent substance 75 are sealed with a transparent epoxy resin 76. At the same time, a radiating surface 77 formed as an upward convex lens is made of the transparent epoxy resin 76. In this configuration, almost the whole part of light emitted from the light-emitting element 72 is reflected by the fluorescent face and moves upward in a state in which irradiation light and excitation light are mixed with each other. On this occasion, light emitted from the light-emitting element 72 is not radiated to the outside directly but is always radiated after the light hits the fluorescent substance 75 once. In addition, because the fluorescent substance 75 is formed on the metal plate 74 which is a highly reflective material, the thickness of the fluorescent substance 75 can be reduced to a half of the thickness required in the related-art transmission type LED. Then, the light is condensed by the radiating surface 77 of the convex lens and radiated externally.

In such a manner, in the LED 71 according to Embodiment 5, all reflected light is radiated in one direction in a state in which irradiation light and excitation light are mixed with each other. Hence, there is no fear of occurrence of the problem in color separation. Moreover, external radiation efficiency is enhanced so that the quantity of light can be increased. In addition, because the radiating surface 77 of the convex lens is provided, light can be condensed by the radiating surface 77 and radiated externally.

In the respective embodiments, the surface of the fluorescent substance on the highly reflective material has a large solid angle with respect to the light-emitting element. Therefore, most of light emitted by the light-emitting element can be covered for wavelength conversion within the fluorescent substance.

The respective embodiments have been described upon the case where a light-emitting element emitting visible light is used in combination with a fluorescent substance containing a fluorescent material which generates fluorescence as visible light when excited by the visible light. As an example of the case, a combination of a blue light-emitting element and a fluorescent material generating yellow fluorescence when irradiated with blue light emitted from the blue light-emitting element has been described. The invention may be applied also to the case where a light-emitting element emitting ultraviolet light is used in combination with a fluorescent substance which contains a fluorescent material and which generates fluorescent as visible light when excited by irradiation with the ultraviolet light. Some fluorescent materials generating light when irradiated with ultraviolet light generate fluorescence in various colors. Accordingly, light in a color selected from various colors can be radiated externally from the fluorescent face. In this case, there is no fear of occurrence of the problem in color separation between irradiation light and excitation light because the fluorescent material is irradiated with ultraviolet light invisible to human eyes to thereby generate fluorescence. In addition, some fluorescent materials generating fluorescence by irradiation with the ultraviolet light can intensively generate light in three primary colors, that is, red, green and blue. Hence, when these fluorescent materials are mixed in optimal mixture proportions to form a fluorescent substance, an LED emitting bright white light can be fabricated. Incidentally, in this case, the lead frames, the metal plate and the thin film need to be made of aluminum exhibiting high reflectance even in the ultraviolet region because silver exhibits low reflectance in the ultraviolet region.

Although the respective embodiments have been described upon the case where a transparent epoxy resin is used as a sealing material, any sealing material may be used if it can satisfy conditions such as fluidity and filling characteristic before curing, and transparency and strength after curing.

Although the respective embodiments have been described upon the case where the light-emitting element and the fluorescent substance are sealed with a resin, the invention may be applied also to the case where they are not sealed with a resin.

The configuration, shape, quantity, material, size and connection relation of the other portions in the light-emitting diode are not limited to the respective embodiments.

As described above, according to the invention, there is provided a light-emitting diode including: a light-emitting element; and a fluorescent face made of a fluorescent substance containing at least one of inorganic or organic fluorescent materials, the fluorescent substance being formed by application on a highly reflective material; wherein light is extracted externally from a side of the fluorescent face irradiated with light emitted from the light-emitting element.

In the LED configured as described above, light emitted from the light-emitting element is radiated externally after the light is reflected by a front or rear surface of the fluorescent face. Generally, both reflection of the light emitted from the light-emitting element for performing irradiation, and generation of fluorescence caused by excitation of the fluorescent material occur most frequently in the front surface of the fluorescent face and its vicinity, the excitation of the fluorescent material being carried out when the light emitted from the light-emitting element is absorbed to the fluorescent material. Therefore, the irradiation light reflected by the front surface of the fluorescent face and the excitation light can be radiated to the outside efficiently without being absorbed to the fluorescent substance. On the other hand, a part of light reflected by the highly reflective material after the light hits the rear surface of the fluorescent face passes through the fluorescent material while the light makes a reciprocating motion in the fluorescent material. Therefore, a large part of the excitation light is mixed with the part of the irradiation light, so that the mixed light is radiated externally. In this manner, the light reflected by the front surface of the fluorescent face and the light reflected by the rear surface of the fluorescent face are combined with each other. Hence, the external radiation efficiency is improved greatly compared with the related art.

In such a manner, light emitted from the light-emitting element is radiated externally after the light is reflected by the front or rear surface of the fluorescent face. As a result, there can be provided a light-emitting diode enhanced in the efficiency in externally radiating both light emitted from the light-emitting element and excitation light (fluorescence).

According to the invention, the fluorescent face formed on the highly reflective material may be disposed to surround side surfaces of the light-emitting element.

When the fluorescent face formed on the highly reflective material is provided to surround the side surfaces of the light-emitting element as described above, light emitted from the side surfaces of the light-emitting element can be also reflected by the fluorescent face so as to be radiated externally as excitation light and irradiation light. Hence, the external radiation efficiency can be improved more greatly.

According to the invention, the fluorescent face may be provided opposite to the light-emitting element.

In the LED configured as described above, a large part of light emitted from a light-emitting surface of the light-emitting element is reflected by the fluorescent face. Hence, the quantity of light reflected by the front and rear surfaces of the fluorescent face is increased remarkably. The light is radiated externally as excitation light and irradiation light. Hence, the external radiation efficiency can be improved greatly.

When the fluorescent face formed on the highly reflective material is provided opposite to the light-emitting element as described above, there can be provided a light-emitting diode greatly improved in the efficiency of externally radiating the excitation light and the irradiation light.

According to the invention, there is provided a light-emitting diode having a configuration as described above, wherein the light-emitting element emits ultraviolet light for performing irradiation; and the fluorescent substance is made of at least one of inorganic or organic fluorescent materials and formed by applying the at least one fluorescent material on the highly reflective material so that the fluorescent material emits light when irradiated with the ultraviolet light.

Fluorescent materials emitting light when irradiated with ultraviolet light may generate fluorescence in various colors. Hence, light in any color selected from various colors can be radiated externally from the fluorescent face. Moreover, there is no fear that the problem in color separation between irradiation light and excitation light occurs because irradiation with ultraviolet light invisible to human eyes is used for generating fluorescence. Further, among fluorescent materials which emit light when irradiated with ultraviolet light, some fluorescent materials emit light intensively in the three primary colors, that is, red, green and blue. Hence, when these fluorescent materials are mixed in optimal mixture proportions to form a fluorescent substance, an LED emitting bright white light can be fabricated.

In this manner, when a light-emitting element emitting ultraviolet light is combined with fluorescent materials emitting light when irradiated with such ultraviolet light, a light-emitting diode emitting light in a color selected from various colors can be fabricated without causing any problem in color separation and, further, a light-emitting diode emitting bright white light can be fabricated.

What is claimed is:

1. A light-emitting diode comprising:

a light-emitting element;

a reflecting substrate adjacent which said light-emitting element is disposed;

a cylindrical reflecting frame disposed directly on said reflecting substrate so as to surround said light-emitting element in a cylindrical interior of said cylindrical reflecting frame;

a fluorescent material on an inner cylindrical surface of said cylindrical reflecting frame and on a surface of said reflecting substrate beneath said light-emitting element; and a transparent material filling the interior of said cylindrical reflecting frame and providing a radiating surface shaped like a concave cone, wherein light emitted from said light-emitting element passes through said fluorescent material to be reflected out of said light emitting diode by said reflecting substrate beneath said light-emitting element and by said inner cylindrical surface of said cylindrical reflecting frame, and is not directly radiated outside of said light-emitting diode.

2. A light-emitting diode according to claim 1, wherein said light-emitting element comprises an ultraviolet light emitting element, and said fluorescent material comprises a material which emits an excitation light when irradiated with ultraviolet light emitted by said ultraviolet light emitting element.

3. A light-emitting diode according to claim 1, further comprising a concave radiating surface above said light-emitting element to reflect inwardly light directly radiated from the light-emitting element.

4. A light-emitting diode comprising:

a light-emitting element;

a reflecting substrate opposed to said light-emitting element and including a concave curved surface shaped like a paraboloid of revolution focused on the light-emitting element; and a fluorescent material on the reflecting substrate beneath said light-emitting element to thereby form a fluorescent face, wherein light emitted from said light-emitting element passes through said fluorescent material to be reflected by said reflecting substrate, and is not directly radiated outside of said light-emitting diode.

5. A light-emitting diode according to claim 4, wherein said reflecting substrate comprises a metal plate comprising aluminum.

6. A light-emitting diode according to claim 4, further comprising a silver thin film on a back side of the fluorescent face.

* * * * *